(12) United States Patent
Tsunekawa et al.

(10) Patent No.: US 8,174,800 B2
(45) Date of Patent: May 8, 2012

(54) MAGNETORESISTIVE ELEMENT, METHOD OF MANUFACTURING THE SAME, AND MAGNETIC MULTILAYERED FILM MANUFACTURING APPARATUS

(75) Inventors: Koji Tsunekawa, Hachioji (JP); David Djayaprawira, Tama (JP)

(73) Assignee: Canon Anelva Corporation, Kawasaki-shi (JP)

( * ) Notice: Subject to any disclaimer, the term of this patent is extended or adjusted under 35 U.S.C. 154(b) by 1006 days.

(21) Appl. No.: 12/114,468

(22) Filed: May 2, 2008

(65) Prior Publication Data

US 2008/0278865 A1 Nov. 13, 2008

(30) Foreign Application Priority Data

May 7, 2007 (JP) ................................. 2007-122367
Apr. 21, 2008 (JP) ................................. 2008-110434

(51) Int. Cl.
*G11B 5/39* (2006.01)
(52) U.S. Cl. ................. 360/324.11; 360/324.2
(58) Field of Classification Search ....... 360/324–324.2; 257/295, 421; 365/158, 171, 173
See application file for complete search history.

(56) References Cited

U.S. PATENT DOCUMENTS

| | | | |
|---|---|---|---|
| 6,052,263 A | 4/2000 | Gill | 360/324.11 |
| 6,149,730 A | 11/2000 | Matsubara et al. | 118/728 |
| 6,226,159 B1 | 5/2001 | Pinarbasi | |
| 6,516,815 B1 | 2/2003 | Stevens et al. | 134/25.4 |
| 6,594,884 B2 | 7/2003 | Pinarbasi | |
| 6,801,414 B2 | 10/2004 | Amano et al. | |
| 6,967,863 B2 * | 11/2005 | Huai | 365/158 |
| 7,079,361 B2 | 7/2006 | Sugita et al. | 360/324 |
| 7,177,120 B2 * | 2/2007 | Freitag et al. | 360/324.11 |
| 7,271,698 B2 | 9/2007 | Mori et al. | |
| 7,280,029 B2 | 10/2007 | Mori et al. | |
| 7,336,453 B2 * | 2/2008 | Hasegawa et al. | 360/324.12 |
| 7,359,163 B2 | 4/2008 | Amano et al. | |
| 7,531,882 B2 * | 5/2009 | Nguyen et al. | 257/421 |
| 7,573,737 B2 * | 8/2009 | Kent et al. | 365/173 |

(Continued)

FOREIGN PATENT DOCUMENTS

JP 64-072522 3/1989

(Continued)

OTHER PUBLICATIONS

Shinji Yuasa et al., "Giant room-temperature magnetoresistance in single-crystal Fe/MgO/Fe magnetic tunnel junctions," Nature Materials, vol. 3, 2004, pp. 868-871, published online by the Nature Publishing Group, Oct. 31, 2004, pp. 1-4.*

(Continued)

*Primary Examiner* — Will J Klimowicz
(74) *Attorney, Agent, or Firm* — Fitzpatrick, Cella, Harper & Scinto (57) ABSTRACT

A magnetoresistive element includes an antiferromagnetic layer formed from a layer containing manganese, a layered magnetization fixed layer which includes a first magnetization fixed layer located over a side of the antiferromagnetic layer and formed from a layer containing a ferromagnetic material and a platinum group metal, a second magnetization fixed layer formed from a layer containing a ferromagnetic material, and a first nonmagnetic intermediate layer located between the first magnetization fixed layer and the second magnetization fixed layer, a magnetic free layer formed from a layer containing a ferromagnetic material, and a second nonmagnetic intermediate layer located between the layered magnetization fixed layer and the magnetic free layer.

5 Claims, 6 Drawing Sheets

U.S. PATENT DOCUMENTS

| | | | |
|---|---|---|---|
| 7,692,902 B2 | 4/2010 | Amano et al. | |
| 7,732,881 B2 * | 6/2010 | Wang | 257/421 |
| 7,859,034 B2 * | 12/2010 | Huai et al. | 257/295 |
| 7,981,697 B2 * | 7/2011 | Wang | 438/3 |
| 2003/0184921 A1 | 10/2003 | Sugita et al. | 360/324.1 |
| 2004/0086752 A1 | 5/2004 | Matsukawa et al. | 428/692 |
| 2005/0122635 A1 * | 6/2005 | Freitag et al. | 360/324.11 |
| 2007/0014053 A1 | 1/2007 | Uesugi et al. | |
| 2007/0230067 A1 * | 10/2007 | Jogo et al. | 360/324.1 |
| 2007/0268631 A1 * | 11/2007 | Guo et al. | 360/324 |
| 2009/0032056 A1 | 2/2009 | Tsunekawa et al. | 134/1.3 |

FOREIGN PATENT DOCUMENTS

| | | | |
|---|---|---|---|
| JP | 08-111315 | | 4/1996 |
| JP | 11-176820 | | 7/1999 |
| JP | 2000-067418 | | 3/2000 |
| JP | 2001-52317 A | | 2/2001 |
| JP | 2001-68757 A | | 3/2001 |
| JP | 2001-135612 | | 5/2001 |
| JP | 2002-158381 A | | 5/2002 |
| JP | 2002-167661 | | 6/2002 |
| JP | 2003-86865 A | | 3/2003 |
| JP | 2003-133614 | | 5/2003 |
| JP | 2003-258335 | | 9/2003 |
| JP | 2003-304012 | | 10/2003 |
| JP | 2003-324225 A | | 11/2003 |
| JP | 2004-47583 A | | 2/2004 |
| JP | 2004-096086 | | 3/2004 |
| JP | 2004-153284 | | 5/2004 |
| JP | 2004165441 A | * | 6/2004 |
| JP | 2005-203774 | | 7/2005 |
| JP | 2005-203790 | | 7/2005 |
| JP | 2006-080116 | | 3/2006 |
| JP | 2006-156893 | | 6/2006 |
| JP | 2006-165265 | | 6/2006 |
| JP | 2006-203064 A | | 8/2006 |
| JP | 2006351684 A | * | 12/2006 |
| JP | 2007-27493 A | | 2/2007 |
| JP | 2007-49118 A | | 2/2007 |
| JP | 2007-073638 | | 3/2007 |
| JP | 2007-184393 | | 7/2007 |

OTHER PUBLICATIONS

Japanese Office Action, dated May 22, 2009, of Japanese Patent Application No. 2007-203054, 5 pages (translation included).

Japanese Office Action dated Apr. 17, 2009 for Japanese Patent Application No. 2008-110434, 8 pages.

Japanese Office Action, dated Oct. 23, 2009, of Japanese Patent Application No. 2008-110434, 9 pages (translation included).

Office Action issued in Japanese Patent Application No. 2009-291333 (Dec. 22, 2011) (3 pages).

* cited by examiner

| | |
|---|---|
| Ta LAYER | 508-3 |
| Cu LAYER | 508-2 |
| $Ni_{83}Fe_{17}$ LAYER | 508-1 |
| $Co_{90}Fe_{10}$ LAYER | 507 |
| Cu LAYER | 506 |
| $Co_{90}Fe_{10}$ LAYER | 505 |
| Ru LAYER | 504 |
| $(Co_{90}Fe_{10})_{100-x}Pt_x$ LAYER | 503 |
| PtMn LAYER | 502 |
| NiFeCr LAYER | 501 |

MAGNETORESISTIVE ELEMENT, METHOD OF MANUFACTURING THE SAME, AND MAGNETIC MULTILAYERED FILM MANUFACTURING APPARATUS

BACKGROUND OF THE INVENTION

1. Field of the Invention

The present invention relates to a magnetoresistive element such as a tunnel magnetoresistive element or a giant magnetoresistive element, a method of manufacturing the same, and a magnetic multilayered film manufacturing apparatus and, more particularly, to a magnetoresistive element such as a tunnel magnetoresistive element or a giant magnetoresistive element usable for the magnetic head of a magnetic disk drive or a magnetic random access memory, a method of manufacturing the same, and a magnetic multilayered film manufacturing apparatus.

2. Description of the Related Art

A conventional magnetic disk drive uses a giant magnetoresistive element or a tunnel magnetoresistive element for its magnetic head.

A giant magnetoresistive element has an antiferromagnetic layer, ferromagnetic fixed layer, nonmagnetic conductive layer, and ferromagnetic free layer. A tunnel magnetoresistive element has an antiferromagnetic layer, ferromagnetic fixed layer, tunnel barrier layer, and ferromagnetic free layer.

The ferromagnetic fixed layer of the giant magnetoresistive element or tunnel magnetoresistive element can use at least one of Fe, Co, and Ni as the ferromagnetic material. The antiferromagnetic layer can use an antiferromagnetic material such as PtMn or IrMn which is obtained by adding a precious metal element to Mn.

However, the conventional magnetoresistive element has poor stability against heat. When the magnetoresistive element is heated to, for example, 300° C. or more, the MR ratio degrades considerably.

Magnetoresistive elements described in Japanese Patent Laid-Open Nos. 2000-67418 (U.S. Pat. No. 6,052,263), 2003-258335, 2003-304012, and 2005-203790 have improved the thermal stability to some extent but have not achieved a sufficient MR ratio for practical use.

The present inventors found, by studies and analyses, the following causes of poor thermal stability of the magnetoresistive element.

For example, in a magnetic head manufacturing process, a tunnel magnetoresistive element undergoes annealing at 250° C. to 300° C. in a high magnetic field of several T (tesla) for several hrs after film formation to magnetize a PtMn layer serving as an antiferromagnetic layer. For a magnetic random access memory, annealing is performed in a post-process at a temperature higher than 300° C., in addition to the annealing in a high magnetic field after film formation. In the annealing process, manganese (Mn) in the above-described antiferromagnetic layer diffuses to other layers such as a ferromagnetic fixed layer and a tunnel barrier layer due to the heat. This degrades the magnetic characteristic of the ferromagnetic fixed layer or the tunnel barrier effect of the tunnel barrier layer. As a result, the MR ratio of the magnetoresistive element degrades.

The ferromagnetic fixed layer or tunnel barrier layer preferably has a crystal structure such as a microcrystalline, polycrystalline, or single-crystal structure. The diffused manganese (Mn) is supposed to adversely affect the crystalline ferromagnetic fixed layer or crystalline tunnel barrier layer and consequently degrade the MR ratio.

Particularly when the ferromagnetic fixed layer has an SAF (Synthetic Anti-Ferromagnet: antiparallel coupling element) structure including three layers: a crystalline first ferromagnetic fixed layer containing cobalt-iron (CoFe) and located on the substrate side, a first nonmagnetic intermediate layer 14 made of, for example, ruthenium (Ru) and located on the ferromagnetic fixed layer, and a crystalline second ferromagnetic fixed layer containing crystalline cobalt-iron-boron (CoFeB), the thermal diffusion of manganese (Mn) in the antiferromagnetic layer adversely affects the ferromagnetic fixed layer, and as a result, the MR ratio of the magnetoresistive element degrades.

The above-described thermal diffusion also occurs in a giant magnetoresistive element.

It is an object of the present invention to provide a magnetoresistive element such as a tunnel magnetoresistive element or a giant magnetoresistive element having a high thermal stability and a high MR ratio, and a method of manufacturing the same.

SUMMARY OF THE INVENTION

In order to achieve the above object, a magnetoresistive element, magnetoresistive element manufacturing method, and magnetic multilayered film manufacturing apparatus according to the present invention mainly have the following arrangements.

According to one aspect of the present invention, there is provided a magnetoresistive element comprising:

an antiferromagnetic layer formed from a layer containing manganese;

a layered magnetization fixed layer which includes a first magnetization fixed layer located over a side of the antiferromagnetic layer and formed from a layer containing a ferromagnetic material and a platinum group metal, a second magnetization fixed layer formed from a layer containing a ferromagnetic material, and a first nonmagnetic intermediate layer located between the first magnetization fixed layer and the second magnetization fixed layer;

a magnetic free layer formed from a layer containing a ferromagnetic material; and a second nonmagnetic intermediate layer located between the layered magnetization fixed layer and the magnetic free layer.

According to another aspect of the present invention, there is provided a method of manufacturing a magnetoresistive element including:

an antiferromagnetic layer;

a layered magnetization fixed layer having a layered structure including a first magnetization fixed layer, a first nonmagnetic intermediate layer, and a second magnetization fixed layer;

a second nonmagnetic intermediate layer; and a magnetic free layer, the method comprising:

the first step of forming the antiferromagnetic layer by sputtering using a target containing manganese (Mn);

the second step of forming the first magnetization fixed layer by sputtering using a target containing a platinum group metal and a target containing a ferromagnetic material after the first step;

the third step of forming the first nonmagnetic intermediate layer by sputtering using a target containing a nonmagnetic material after the second step;

the fourth step of forming the second magnetization fixed layer by sputtering using a target containing a ferromagnetic material after the third step;

the fifth step of forming the second nonmagnetic intermediate layer by sputtering using a target containing a nonmagnetic material after the fourth step;

the sixth step of forming the magnetic free layer by sputtering using a target containing a ferromagnetic material after the fifth step; and the seventh step of annealing, in an annealing furnace, the antiferromagnetic layer, the layered magnetization fixed layer having the layered structure including the first magnetization fixed layer, the first nonmagnetic intermediate layer, and the second magnetization fixed layer, the second nonmagnetic intermediate layer, and the magnetic free layer after the sixth step.

According to still another aspect of the present invention, there is provided a method of manufacturing a magnetoresistive element including:

an antiferromagnetic layer;

a layered magnetization fixed layer having a layered structure including a first magnetization fixed layer, a first nonmagnetic intermediate layer, and a second magnetization fixed layer;

a second nonmagnetic intermediate layer; and a magnetic free layer, the method comprising:

the first step of forming the antiferromagnetic layer by sputtering using a target containing manganese (Mn);

the second step of forming the first magnetization fixed layer by sputtering using a target containing a platinum group metal and a ferromagnetic material after the first step;

the third step of forming the first nonmagnetic intermediate layer by sputtering using a target containing a nonmagnetic material after the second step;

the fourth step of forming the second magnetization fixed layer by sputtering using a target containing a ferromagnetic material after the third step;

the fifth step of forming the second nonmagnetic intermediate layer by sputtering using a target containing a nonmagnetic material after the fourth step;

the sixth step of forming the magnetic free layer by sputtering using a target containing a ferromagnetic material after the fifth step; and the seventh step of annealing, in an annealing furnace, the antiferromagnetic layer, the layered magnetization fixed layer having the layered structure including the first magnetization fixed layer, the first nonmagnetic intermediate layer, and the second magnetization fixed layer, the second nonmagnetic intermediate layer, and the magnetic free layer after the sixth step.

According to yet another aspect of the present invention, there is provided a magnetic multilayered film manufacturing apparatus comprising:

a transfer chamber having a robot transfer unit;

a load mechanism adapted to load, into the transfer chamber, a substrate to form a magnetic multilayered film;

a first film formation chamber connected to the transfer chamber via a gate valve and adapted to form an antiferromagnetic layer over the substrate transferred by the robot transfer unit by sputtering using an antiferromagnetic target containing manganese (Mn);

a second film formation chamber connected to the transfer chamber via a gate valve and adapted to form a first ferromagnetic fixed layer containing a platinum group metal over the substrate transferred by the robot transfer unit by sputtering using a ferromagnetic target containing a platinum group metal;

a third film formation chamber connected to the transfer chamber via a gate valve and adapted to form a second ferromagnetic fixed layer over the substrate transferred by the robot transfer unit by sputtering using a ferromagnetic target containing a ferromagnetic material;

a fourth film formation chamber connected to the transfer chamber via a gate valve and adapted to form a first nonmagnetic intermediate layer over the substrate transferred by the robot transfer unit by sputtering using a nonmagnetic target;

a fifth film formation chamber connected to the transfer chamber via a gate valve and adapted to form a crystalline magnesium oxide layer over the substrate transferred by the robot transfer unit; and an unload mechanism adapted to unload the substrate having a layered structure including the antiferromagnetic layer, the first ferromagnetic fixed layer over the antiferromagnetic layer, the first nonmagnetic intermediate layer over the first ferromagnetic fixed layer, the second ferromagnetic fixed layer over the first nonmagnetic intermediate layer, and the crystalline magnesium oxide layer.

According to still yet another aspect of the present invention, there is provided a magnetic multilayered film manufacturing apparatus comprising:

a transfer chamber having a robot transfer unit;

a load mechanism adapted to load, into the transfer chamber, a substrate to form a magnetic multilayered film;

a first film formation chamber connected to the transfer chamber via a gate valve and adapted to form an antiferromagnetic layer over the substrate transferred by the robot transfer unit by sputtering using an antiferromagnetic target containing manganese (Mn);

a second film formation chamber connected to the transfer chamber via a gate valve and adapted to form a first ferromagnetic fixed layer containing a platinum group metal over the substrate transferred by the robot transfer unit by cosputtering using a platinum target containing a platinum group metal and a target containing a ferromagnetic material;

a third film formation chamber connected to the transfer chamber via a gate valve and adapted to form a second ferromagnetic fixed layer over the substrate transferred by the robot transfer unit by sputtering using a ferromagnetic target containing a ferromagnetic material;

a fourth film formation chamber connected to the transfer chamber via a gate valve and adapted to form a first nonmagnetic intermediate layer over the substrate transferred by the robot transfer unit by sputtering using a nonmagnetic target;

a fifth film formation chamber connected to the transfer chamber via a gate valve and adapted to form a crystalline magnesium oxide layer over the substrate transferred by the robot transfer unit; and an unload mechanism adapted to unload the substrate having a layered structure including the antiferromagnetic layer, the first ferromagnetic fixed layer over the antiferromagnetic layer, the first nonmagnetic intermediate layer over the first ferromagnetic fixed layer, the second ferromagnetic fixed layer over the first nonmagnetic intermediate layer, and the crystalline magnesium oxide layer.

According to yet still another aspect of the present invention, there is provided a magnetic multilayered film manufacturing apparatus comprising:

a transfer chamber having a robot transfer unit;

a load mechanism adapted to load, into the transfer chamber, a substrate to form a magnetic multilayered film;

a film formation chamber connected to the transfer chamber via a gate valve and adapted to form an antiferromagnetic layer over the substrate transferred by the robot transfer unit by sputtering using an antiferromagnetic target containing manganese (Mn), and to form a first ferromagnetic fixed layer containing a platinum group metal by cosputtering using a platinum-containing target containing a platinum group metal and a ferromagnetic target containing a ferromagnetic material, and to form a nonmagnetic intermediate layer by sputtering using a nonmagnetic target, and to form a second ferromagnetic fixed layer by sputtering using a ferromagnetic target containing a ferromagnetic material; and an unload mechanism adapted to unload the substrate having a layered structure including the antiferromagnetic layer, the first ferromagnetic fixed layer over the antiferromagnetic layer, the nonmagnetic intermediate layer over the first ferromagnetic fixed layer, the second ferromagnetic fixed layer over the nonmagnetic intermediate layer.

According to still yet another aspect of the present invention, there is provided a magnetic multilayered film manufacturing apparatus comprising:

a transfer chamber having a robot transfer unit;

a load mechanism adapted to load, into the transfer chamber, a substrate to form a magnetic multilayered film;

a first film formation chamber connected to the transfer chamber via a gate valve and adapted to form an antiferromagnetic layer over the substrate transferred by the robot transfer unit by sputtering using an antiferromagnetic target containing manganese (Mn), and to form a first ferromagnetic fixed layer containing a platinum group metal by cosputtering using a platinum-containing target containing a platinum group metal and a ferromagnetic target containing a ferromagnetic material, and to form a nonmagnetic intermediate layer by sputtering using a nonmagnetic target, and to form a second ferromagnetic fixed layer by sputtering using a ferromagnetic target containing a ferromagnetic material;

a second film formation chamber connected to the transfer chamber via a gate valve and adapted to form a magnesium oxide layer or a metal magnesium layer over the substrate transferred by the robot transfer unit by sputtering using a magnesium oxide target or a metal magnesium target; and an unload mechanism adapted to unload the substrate having a layered structure including the antiferromagnetic layer, the first ferromagnetic fixed layer over the antiferromagnetic layer, the nonmagnetic intermediate layer over the first ferromagnetic fixed layer, the second ferromagnetic fixed layer over the nonmagnetic intermediate layer, and the magnesium oxide layer or the metal magnesium layer.

According to the present invention, it is possible to obtain a magnetoresistive element having a higher thermal stability and a higher MR ratio.

Further features of the present invention will become apparent from the following description of exemplary embodiments with reference to the attached drawings.

DESCRIPTION OF THE EMBODIMENTS

Preferred embodiments of the present invention will now be described in detail with reference to the accompanying drawings. Note that the constituent elements described in the embodiments are merely examples. The technical scope of the present invention is determined by the scope of claims and is not limited by the following individual embodiments.

Figure 1:
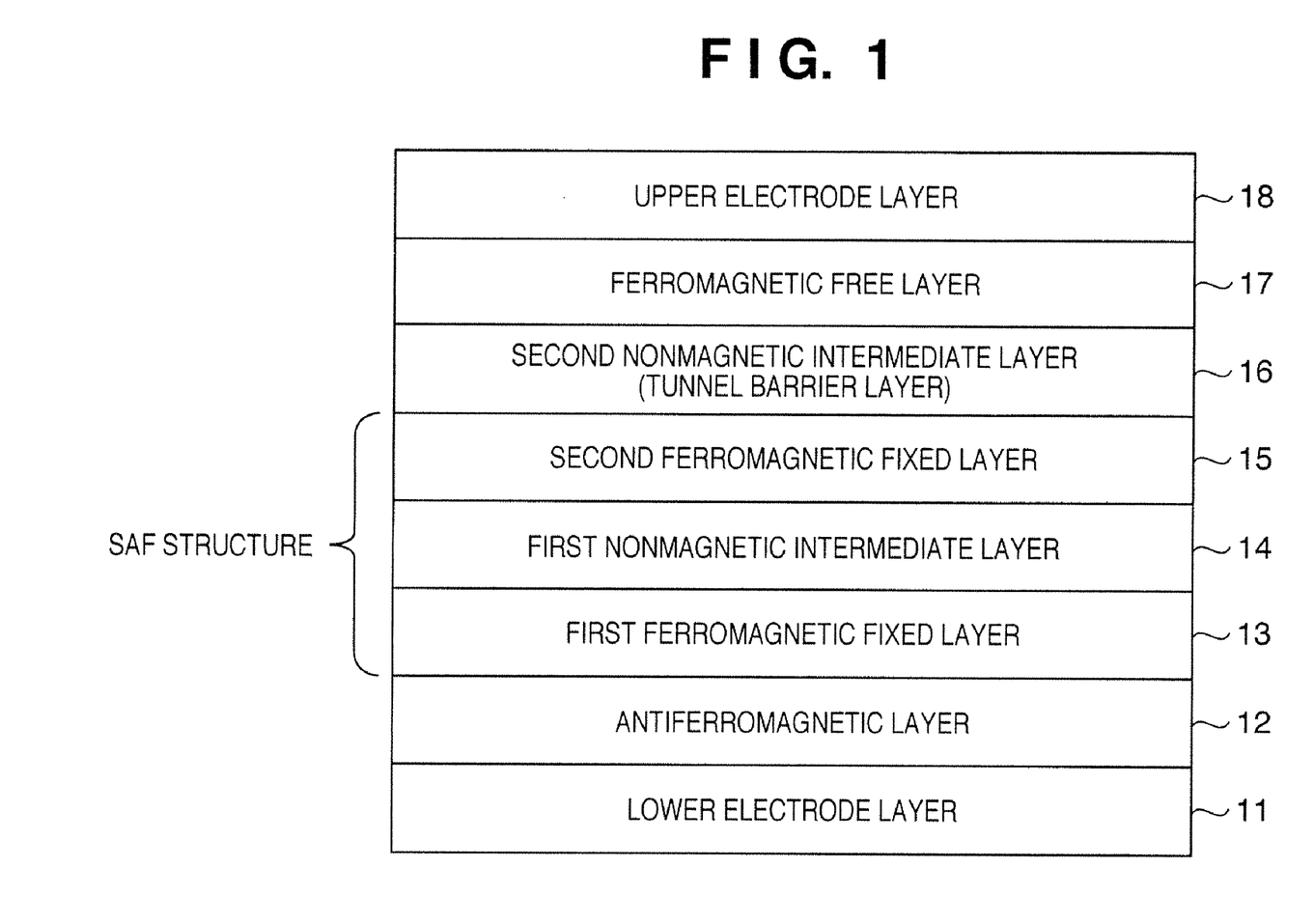
FIG. 1 is a sectional view of a tunnel magnetoresistive element according to an embodiment of the present invention.

FIG. 1 is a sectional view of a tunnel magnetoresistive element according to the first embodiment of the present invention.

The tunnel magnetoresistive element of this embodiment is formed by stacking a lower electrode layer 11, antiferromagnetic layer 12, first ferromagnetic fixed layer (first magnetization fixed layer) 13, first nonmagnetic intermediate layer 14, second ferromagnetic fixed layer (second magnetization fixed layer) 15, second nonmagnetic intermediate layer (tunnel barrier layer) 16, ferromagnetic free layer (magnetization free layer) 17, and upper electrode layer 18 in this order. Film formation is done by, for example, DC sputtering. The magnetic moment of the first ferromagnetic fixed layer 13 is fixed in one direction by the exchange coupling with the antiferromagnetic layer 12. The magnetic moment of the second ferromagnetic fixed layer 15 is fixed in a direction antiparallel to the first ferromagnetic fixed layer 13 by the antiferromagnetic exchange coupling with the first ferromagnetic fixed layer 13 via the first nonmagnetic intermediate layer 14. The layered magnetization fixed layer having the three layers, the first ferromagnetic fixed layer 13, first nonmagnetic intermediate layer 14, and second ferromagnetic fixed layer 15 forms the above SAF structure.

The ferromagnetic fixed layer of the present invention is not limited to the three-layered structure including the first ferromagnetic fixed layer 13, first nonmagnetic intermediate layer 14, and second ferromagnetic fixed layer 15. The ferromagnetic fixed layer may include a single ferromagnetic layer or a layered structure including four or more layers.

The antiferromagnetic layer 12 of the present invention uses, for example, platinum manganese (PtMn) or iridium manganese (IrMn). The antiferromagnetic layer 12 is obtained by film formation using sputtering, CVD (Chemical Vapor Deposition), ion beam deposition, or epitaxial method.

The first ferromagnetic fixed layer 13 of the present invention can use an alloy which contains a platinum group metal and at least one metal selected from the group consisting of Fe, Co, and Ni and is expressed by a general formula A.

General formula A (where $0 \leq a < 100$, $0 \leq b < 100$, $0 \leq c < 100$, $a+b+c=100$, $95.5 \geq d \geq 50$, $0.5 \leq e \leq 50$, $d+e=100$; M represents a platinum group metal)

In the present invention, at least one element selected from the group consisting of platinum (Pt), iridium (Ir), osmium (Os), palladium (Pd), ruthenium (Ru), and rhodium (Rh) (or an alloy of the elements) is usable as the platinum group metal. Particularly, in the present invention, platinum (Pt) is preferably used as the platinum group metal.

The content of the platinum group metal in an alloy is 0.5 at % to 50 at % and, preferably, 10 at % to 40 at %.

In the present invention, when at least one metal selected from the platinum group elements is added to the first ferromagnetic fixed layer 13 made of a CoFe alloy or a CoFeNi alloy, thermal diffusion of Mn in the antiferromagnetic layer 12 can be suppressed. It is consequently possible to suppress diffusion into the second ferromagnetic fixed layer 15 and second nonmagnetic intermediate layer (tunnel barrier layer) 16 to be described below.

In the first ferromagnetic fixed layer 13 of the present invention, an alloy expressed by the general formula A can contain boron (B) of 0.5 at % to 30 at % and, preferably, 5 at % to 25 at %.

In the present invention, a film of an alloy expressed by the general formula A or an alloy obtained by adding B (boron) to the alloy is formed using sputtering, CVD, ion beam deposition, or epitaxial method.

The formed first ferromagnetic fixed layer 13 can have a non-single-crystal structure such as an amorphous, microcrystalline, or polycrystalline structure, or a single-crystal structure.

Particularly in the present invention, the first ferromagnetic fixed layer 13 made of a ferromagnetic material having a polycrystalline structure is advantageous for enhancing the effect.

According to the present invention, since the SAF structure is used to the first ferromagnetic fixed layer 13, the thermal stability of the tunnel magnetoresistive element can be improved.

The second ferromagnetic fixed layer 15 of the present invention can preferably use an alloy which contains at least one metal selected from the group consisting of Fe, Co, and Ni, or an alloy which contains the above alloy and boron (B) and is expressed by a general formula B.

$(Fe_xCo_yNi_z)_m(B)_n$   General formula B (where $0 \leq x < 100$, $0 \leq y < 100$, $0 \leq z < 100$, $x+y+z=100$, $m+n=100$, $0 \leq n < 30$, $70 < m \leq 100$)

The second ferromagnetic fixed layer 15 can additively contain a platinum group metal, that is, a platinum group element such as platinum (Pt), iridium (Ir), osmium (Os), palladium (Pd), ruthenium (Ru), or rhodium (Rh). The content of the platinum group metal in the alloy is 0.5 at % to 30 at % and, preferably, 5 at % to 25 at %. Of the platinum group metals, platinum (Pt) is particularly preferably used.

The first nonmagnetic intermediate layer 14 of the present invention can use ruthenium (Ru), rhodium (Rh), chromium (Cr), iridium (Ir), or an alloy thereof. A layered body including a first layer made of ruthenium (Ru), rhodium (Rh), chromium (Cr), iridium (Ir), or an alloy thereof, and a second layer made of copper (Cu), silver (Ag), gold (Au), aluminum (Al), or an alloy thereof is also usable.

The first nonmagnetic intermediate layer 14 of the present invention is obtained by film formation using sputtering, CVD, ion beam deposition, or epitaxial method.

In the tunnel magnetoresistive element of the present invention, the second nonmagnetic intermediate layer 16 functions as a tunnel barrier layer. The tunnel barrier layer can use a magnesium oxide $((Mg)_f(O)_g$; $f+g=100$, $40<f<60$, $40<g<60)$ having a non-single-crystal structure such as an amorphous, microcrystalline, or polycrystalline structure, or a single-crystal structure. The tunnel barrier layer is obtained by film formation using sputtering, CVD, ion beam deposition, or epitaxial method.

The polycrystalline or single-crystal magnesium oxide used in the tunnel barrier layer of the present invention preferably has, in its layer, a (100)-plane crystal parallel to the layer interface in the direction of thickness.

In the giant magnetoresistive element of the present invention, the second nonmagnetic intermediate layer 16 can use a nonmagnetic material such as copper (Cu).

The ferromagnetic free layer 17 of the present invention is obtained by, for example, sputtering using a ferromagnetic target containing an alloy containing an element selected from the group consisting of iron (Fe), nickel (Ni), and cobalt (Co), and for example, a cobalt iron (CoFe) alloy or a cobalt iron nickel (CoFeNi) alloy.

In the present invention, the ferromagnetic free layer 17 contains boron (B) or the above-described platinum group metal.

Figure 2:
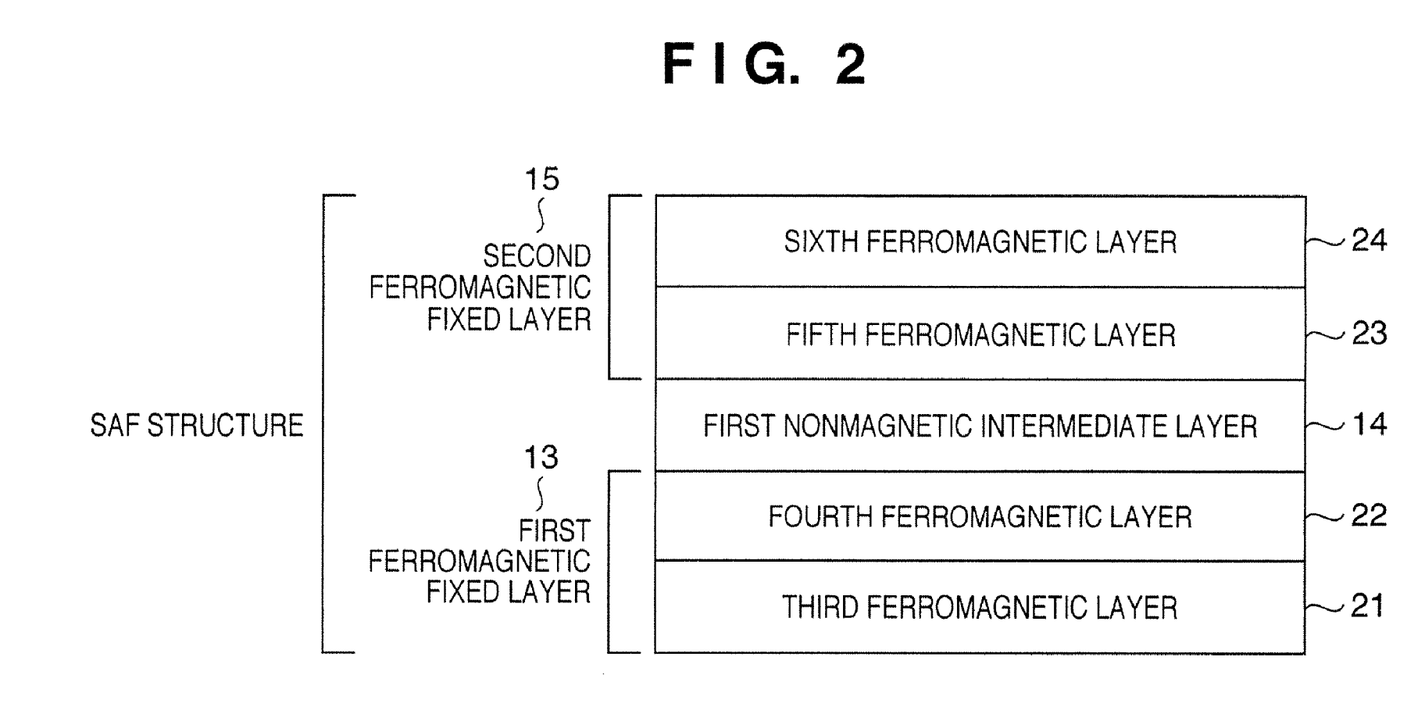
FIG. 2 is a sectional view of a tunnel magnetoresistive element according to another embodiment of the present invention.

FIG. 2 shows the second embodiment of the present invention and, more specifically, another form of the SAF structure of the above-described first embodiment.

A first ferromagnetic fixed layer 13 in the SAF structure shown in FIG. 2 has a layered structure of a third ferromagnetic layer 21 and a fourth ferromagnetic layer 22. A second ferromagnetic fixed layer 15 has a layered structure of a fifth ferromagnetic layer 23 and a sixth ferromagnetic layer 24.

The third ferromagnetic layer 21 can use an alloy which contains a platinum group metal and at least one metal selected from the group consisting of Fe, Co, and Ni and is expressed by the general formula A. The content of the platinum group metal in this alloy is 0.5 at % to 50 at % and, preferably, 10 at % to 40 at %.

In the second embodiment, when at least one metal selected from the platinum group elements is added to the third ferromagnetic layer 21 made of a CoFe alloy or a CoFeNi alloy, thermal diffusion of Mn in an antiferromagnetic layer 12 can be suppressed. It is consequently possible to suppress diffusion into the second ferromagnetic fixed layer 15 and a second nonmagnetic intermediate layer 16 to be described below.

In the third ferromagnetic layer 21 of the present invention, an alloy expressed by the general formula A can contain boron (B) of 0.5 at % to 30 at % and, preferably, 5 at % to 25 at %.

In the second embodiment, a film of an alloy expressed by the general formula A or an alloy obtained by adding boron (B) to the alloy is formed using sputtering, CVD, ion beam deposition, or epitaxial method.

The formed third ferromagnetic layer 21 can have a non-single-crystal structure such as an amorphous, microcrystalline, or polycrystalline structure, or a single-crystal structure.

Particularly in the second embodiment, the third ferromagnetic layer 21 made of a ferromagnetic material having a polycrystalline structure is advantageous for enhancing the effect.

The fourth ferromagnetic layer 22, fifth ferromagnetic layer 23, and sixth ferromagnetic layer 24 of the second embodiment can preferably use an alloy which contains at least one metal selected from the group consisting of Fe, Co, and Ni, or an alloy which contains the above alloy and boron (B) and is expressed by the general formula B.

In the second embodiment, at least one of the fourth ferromagnetic layer 22, fifth ferromagnetic layer 23 and sixth ferromagnetic layer 24 and, preferably, all of them can additively contain a platinum group metal, that is, a platinum group element such as platinum (Pt), iridium (Ir), osmium (Os), palladium (Pd), ruthenium (Ru), or rhodium (Rh). The content of the platinum group metal in the alloy is 0.5 at % to 30 at % and, preferably, 5 at % to 25 at %. Of the platinum group metals, platinum (Pt) is particularly preferably used.

Figure 3:
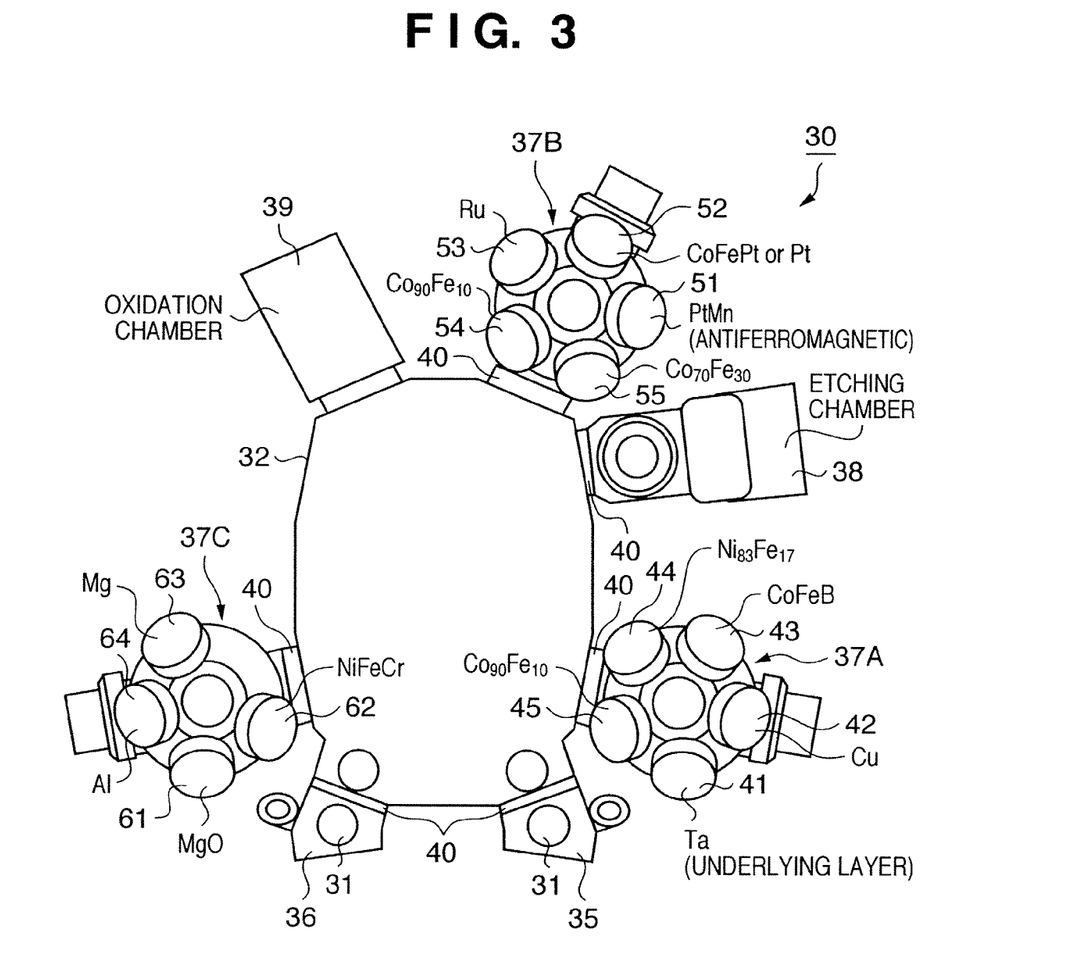
FIG. 3 is a view showing the schematic arrangement of a magnetoresistive element manufacturing apparatus according to the present invention.

A method and apparatus for manufacturing a tunnel magnetoresistive element having the above-described layered structure will be described next with reference to FIG. 3. FIG. 3 is a schematic plan view of the apparatus for manufacturing a tunnel magnetoresistive element. This is a mass-production sputtering film formation apparatus capable of manufacturing a multilayered film including a plurality of magnetic films.

A magnetic multilayered film manufacturing apparatus 30 shown in FIG. 3 is a cluster type apparatus having a plurality of film formation chambers based on sputtering. In the apparatus 30, a transfer chamber 32 having a robot transfer unit (not shown) is installed at the central position. The transfer chamber 32 of the magnetic multilayered film manufacturing apparatus 30 has two load/unload chambers 35 and 36 each of which loads and unloads a substrate (silicon substrate) 31.

Multilayered films can be manufactured at a high productivity by alternately using the load/unload chambers 35 and 36.

The magnetic multilayered film manufacturing apparatus 30 includes, for example, three film formation chambers 37A, 37B, and 37C and one etching chamber 38 and one oxidation chamber 39 around the transfer chamber 32. The etching chamber 38 etches a necessary surface of a tunnel magnetoresistive element. The oxidation chamber 39 oxidizes a metal film and forms a tunnel barrier layer of an oxidization film. Gate valves 40 that can freely open/close as needed are provided between the chambers (37A, 37B, 37C, 38, 39) and the transfer chamber 32 to separate the chambers (37A, 37B, 37C, 38, 39) from each other. Each chamber has a vacuum exhaust mechanism, gas introduction mechanism, power supply mechanism, and the like (none are shown).

In each of the film formation chambers 37A, 37B, and 37C of the magnetic multilayered film manufacturing apparatus 30, the above-described magnetic films are sequentially deposited on the substrate 31 from the lower side by sputtering. For example, four or five targets (tantalum (Ta) 41, Copper (Cu) 42, cobalt iron boron (CoFeB) 43, nickel iron (NiFe) 44, and cobalt iron ($Co_{90}Fe_{10}$) 45), (platinum manganese (PtMn) 51, cobalt iron platinum (CoFePt) 52, ruthenium (Ru) 53, cobalt iron ($Co_{90}Fe_{10}$) 54, and cobalt iron ($Co_{70}Fe_{30}$) 55), and (magnesium oxide (MgO) 61, nickel iron chromium (NiFeCr) 62, magnesium (Mg) 63, and aluminum (Al) 64) located on an appropriate circumference are arranged on the ceiling of each of the film formation chambers 37A, 37B, and 37C. The substrate 31 is arranged on a substrate holder located at a position coaxial with the circumference.

The targets (41, 42, 43, 44, and 45) (51, 52, 53, 54, and 55), and (61, 62, 63, and 64) are selected in accordance with the materials of a layer to be formed. The target 52 of the first ferromagnetic fixed layer 13 can be, for example, a cobalt iron platinum (CoFePt) target. Alternatively, the first ferromagnetic fixed layer 13 may be formed by cosputtering using a platinum (Pt) target as the target 52 and a cobalt iron ($Co_{70}Fe_{30}$) target as the target 55. Alternatively, the first ferromagnetic fixed layer 13 may be formed by cosputtering using a platinum (Pt) target as the target 52 and a cobalt iron ($Co_{90}Fe_{10}$) target as the target 54.

The material of the target 41 can be "Ta" for the lower electrode layer and the upper electrode layer. The material of the target 43 can be "CoFeB" for the second ferromagnetic fixed layer 15. The material of the target 51 can be a "PtMn" target for the antiferromagnetic layer 12. The material of the target 53 can be an "Ru" target for the first nonmagnetic intermediate layer 14. The material of the target 61 can be an "MgO" target for the second nonmagnetic intermediate layer 16 serving as a tunnel barrier layer. In a case where a tunnel barrier is formed by an oxidation treatment, the targets 63 and 64 can be "Mg" and "Al" targets for forming metal films to be a precursor.

To efficiently deposit a magnetic film having an appropriate composition, the plurality of targets are tilted toward the substrate. However, they may be parallel to the substrate surface. The plurality of targets and the substrate are rotated relatively. In the apparatus 30 having the above arrangement, the magnetic multilayered film shown in FIG. 1 is sequentially formed on the substrate 31 by sputtering using the film formation chambers 37A, 37B, and 37C.

In the above embodiment, a tunnel magnetoresistive element has been described. In the present invention, a giant magnetoresistive element can be formed by changing the above-described tunnel barrier layer to a nonmagnetic conductive layer of, for example, copper (Cu).

The tunnel magnetoresistive element which has completed film formation by sputtering in the film formation chambers 37A, 37B, and 37C undergoes an annealing process in an annealing furnace. The annealing temperature is, for example, about 200° C. to 400° C. The annealing process is performed in a magnetic field of, for example, 8 kOe (64 kA/m) for, for example, 4 hrs. This process gives a necessary magnetization to PtMn in the antiferromagnetic layer of the tunnel magnetoresistive element.

Examples of the present invention will be described next with reference to the accompanying drawings.

EXAMPLE 1

Figure 4:
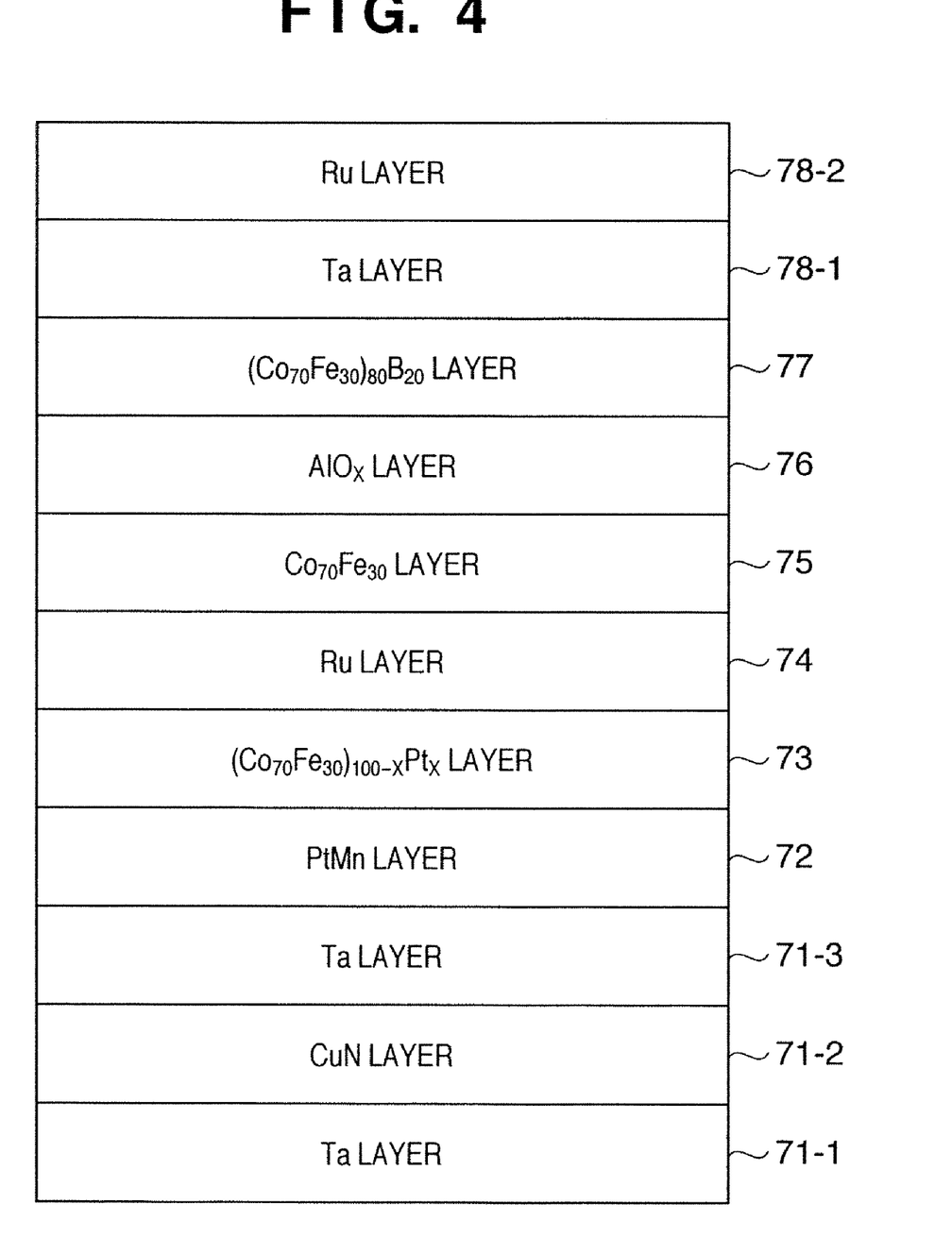
FIG. 4 is a sectional view of a tunnel magnetoresistive element according to Example 1.

FIG. 4 is a sectional view showing the structure of a tunnel magnetoresistive element according to Example 1 of the present invention. The tunnel magnetoresistive element of Example 1 is a bottom-type tunnel magnetoresistive element corresponding to the structure shown in FIG. 1.

Referring to FIG. 4, a Ta layer 71-1 (the target 41 is used), CuN layer 71-2 (the target 42 is used), and Ta layer 71-3 (the target 41 is used) have thicknesses of 5 nm, 20 nm, and 3 nm, respectively, and form a lower electrode layer. A PtMn layer 72 (the target 51 is used) has a thickness of 15 nm and serves as an antiferromagnetic layer. A $(Co_{70}Fe_{30})_{100-x}Pt_x$ layer 73 (cosputtering of the target 52 and the target 55 is used) has a thickness of 2.5 nm and serves as a first ferromagnetic fixed layer. An Ru layer 74 (the target 53 is used) has a thickness of 0.85 nm and serves as a nonmagnetic layer (nonmagnetic intermediate layer). A $Co_{70}Fe_{30}$ layer 75 (the target 55 is used) has a thickness of 2.5 nm and serves as a second ferromagnetic fixed layer. An $AlO_x$ layer 76 (the target 64 is used) has a thickness of 1.2 nm and serves as a second nonmagnetic intermediate layer (tunnel barrier layer). A $(Co_{70}Fe_{30})_{80}B_{20}$ layer 77 (the target 43 is used) has a thickness of 3 nm and serves as a ferromagnetic free layer. A Ta layer 78-1 (the target 41 is used) and an Ru layer 78-2 (the target 53 is used) have thicknesses of 10 nm and 7 nm, respectively, and form an upper electrode layer. In Example 1, platinum (Pt) was added to the first ferromagnetic fixed layer in the contents (at %) shown in Table 1. The $AlO_x$ layer 76 is, after Al layer is formed, oxidized in the oxidation chamber 39 shown in FIG. 3. It is also possible to use a tunnel barrier layer of the magnesium oxide (MgO) instead of the $AlO_x$ layer 76. In this case, a magnesium oxide (MgO) target or a metal magnesium target can be used as the target 64. In a case where the metal magnesium target is used, the oxidation treatment is executed in order to oxidize the metal magnesium layer in the oxidation chamber 39.

The obtained tunnel magnetoresistive elements were transported to the annealing chamber and annealed at 270° C., 300° C., and 330° C. The MR ratios (%) for the respective temperatures were measured. Table 1 shows the result.

TABLE 1

| | Temperature dependence of MR ratio (%) | | | | |
|---|---|---|---|---|---|
| Annealing | Pt content (at %) | | | | |
| temperature | 0 at % | 5.9 at % | 11.7 at % | 18 at % | 24 at % |
| 270° C. | 58 | 58 | 59 | 59 | 60 |
| 300° C. | 35 | 40 | 45 | 52 | 53 |
| 330° C. | 5 | 11 | 15 | 35 | 45 |

According to Table 1, without platinum (Pt), the MR ratio (%) decreased as the annealing temperature rose. The rate of decrease in the MR ratio lowered when Pt was added, as can be seen. In particular, the temperature dependence of the MR ratio (%) was improved by adding platinum (Pt). Particularly when the content of platinum (Pt) exceeded 18 at %, the rate of decrease in the MR ratio largely lowered.

The upper limit of the content of platinum (Pt) is not particularly limited but is preferably 50 at %.

EXAMPLE 2

Tunnel magnetoresistive elements were manufactured in the same way as described above using iridium (Ir), osmium (Os), palladium (Pd), rhodium (Rh), and ruthenium (Ru) in place of platinum (Pt) used in Example 1, and the temperature dependence test as in Example 1 was carried out. As a result, the temperature dependence was improved, as in Example 1.

EXAMPLE 3

Tunnel magnetoresistive elements were manufactured in the same way as in Example 1 except that the $Co_{70}Fe_{30}$ layer 75 serving as the second ferromagnetic fixed layer of Example 1 was changed to a $Co_{70}Fe_{20}Pt_{10}$ layer, and the temperature dependence was tested in the same way as in Example 1. Table 2 shows the result.

TABLE 2

Temperature dependence of MR ratio (%)

| Annealing temperature | Pt content (at %) | | | | |
|---|---|---|---|---|---|
| | 0 | 5.9 | 11.7 | 18 | 24 |
| 270° C. | 58 | 60 | 60 | 65 | 70 |
| 300° C. | 35 | 40 | 50 | 55 | 65 |
| 330° C. | 5 | 22 | 25 | 57 | 60 |

COMPARATIVE EXAMPLE 1

Tunnel magnetoresistive elements were manufactured in the same way as in Example 3 except that the $(Co_{70}Fe_{30})_{100-x}Pt_x$ layer 73 serving as the first ferromagnetic fixed layer of Example 3 was changed to a $Co_{70}Fe_{30}$ layer containing no platinum, and the temperature dependence was tested in the same way as in Example 1. Table 3 shows the result.

TABLE 3

First ferromagnetic fixed layer containing no platinum (Pt)

| Annealing temperature | Temperature dependence of MR ratio (%) |
|---|---|
| 270° C. | 56 |
| 300° C. | 34 |
| 330° C. | 6 |

EXAMPLE 4

Figure 5:
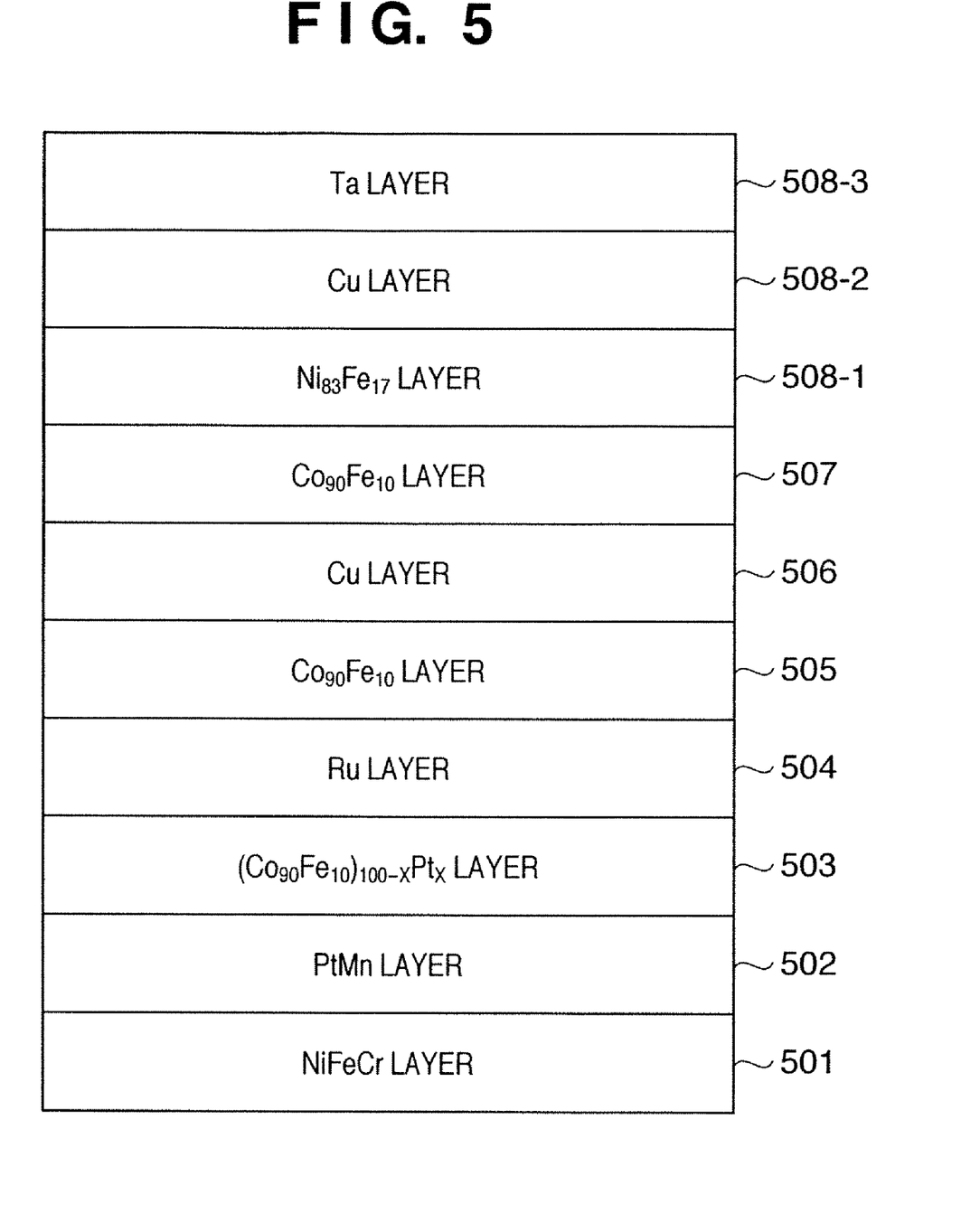
FIG. 5 is a sectional view of a giant magnetoresistive element according to the present invention.

FIG. 5 is a sectional view showing the structure of a giant magnetoresistive element according to Example 4 of the present invention. The giant magnetoresistive element of Example 4 is a bottom-type giant magnetoresistive element.

Figure 6:
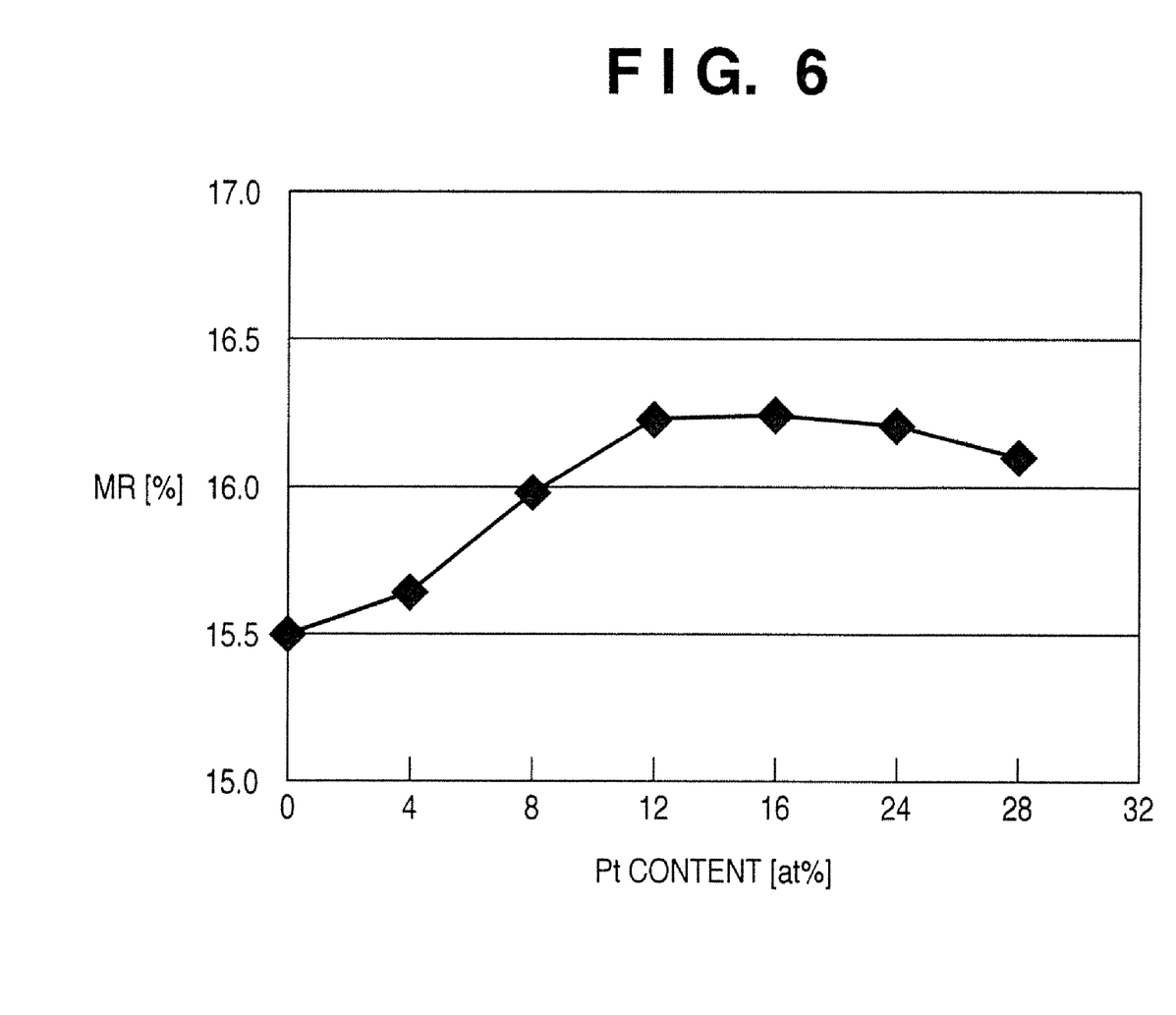
FIG. 6 is a graph showing the temperature dependence of the element shown in FIG. 5.

Referring to FIG. 5, a nickel-iron-chromium (NiFeCr) layer 501 (the target 62 is used) has a thickness of 4 nm and serves as a lower electrode layer. A platinum-manganese (PtMn) layer 502 (the target 51 is used) has a thickness of 12 nm and serves as an antiferromagnetic layer. A cobalt iron platinum $(Co_{90}Fe_{10})_{100-x}Pt_x$ layer 503 (cosputtering of the target 52 (CoFePt) and the target 54 is used) has a thickness of 1.8 nm and serves as a first ferromagnetic fixed layer. A ruthenium (Ru) layer 504 (the target 53 is used) has a thickness of 0.9 nm and serves as a first nonmagnetic intermediate layer. A cobalt-iron $(Co_{90}Fe_{10})$ layer 505 (the target 54 is used) has a thickness of 2.2 nm and serves as a second ferromagnetic fixed layer. A copper (Cu) layer 506 (the target 42 is used) has a thickness of 2 nm and serves as a second nonmagnetic intermediate layer. A cobalt-iron $(Co_{90}Fe_{10})$ layer 507 (the target 45 is used) has a thickness of 1.3 nm and serves as a ferromagnetic free layer. A nickel-iron $(Ni_{83}Fe_{17})$ layer 508-1 (the target 44 is used), copper (Cu) layer 508-2 (the target 42 is used), and tantalum (Ta) layer 508-3 (the target 41 is used) have thicknesses of 2.5 nm, 6 nm, and 3 nm, respectively, and form an upper electrode layer. In Example 4, platinum (Pt) was added to the first ferromagnetic fixed layer. The elements were annealed at 300° C., and the MR ratios (%) were measured. FIG. 6 shows the result.

FIG. 6 is a graph showing the relationship between the MR ratios (%) of giant magnetoresistive elements annealed (300° C.) in a high magnetic field of 0.8 T for 4 hrs and the contents of platinum (Pt) in the first ferromagnetic fixed layer. The MR ratio (%) rose as the content of platinum (Pt) increased. An MR ratio (%) of about 16.0% was obtained at 8 at %. An MR ratio (%) of about 16.3% was obtained when the content of platinum (Pt) was 12 to 24 at %. The MR ratio (%) increased by about 0.8% from that (15.5%) without platinum (Pt). The upper limit of the content of platinum (Pt) is defined in a range preferable for the ferromagnetic layer. The upper limit is about 50 at %. Hence, the content of platinum (Pt) is 0 at % (exclusive) to 50 at % (inclusive), preferably 8 at % (inclusive) to 50 at % (inclusive), and more preferably 12 at % (inclusive) to 24 at % (inclusive).

The tunnel magnetoresistive element and giant magnetoresistive element of the present invention are usable for the magnetic head of a magnetic disk drive or a magnetic random access memory.

While the present invention has been described with reference to exemplary embodiments, it is to be understood that the invention is not limited to the disclosed exemplary embodiments. The scope of the following claims is to be accorded the broadest interpretation so as to encompass all such modifications and equivalent structures and functions.

This application claims the benefit of Japanese Patent Application No. 2007-122367, filed May 7, 2007, Japanese Patent Application No. 2008-110434, filed Apr. 21, 2008, which are hereby incorporated by reference herein in their entirety.

What is claimed is:
1. A magnetoresistive element comprising:
an antiferromagnetic layer;
a layered magnetization fixed layer adjacent to the antiferromagnetic layer;
a first nonmagnetic intermediate layer adjacent to the layered magnetization fixed layer; and
a magnetic free layer adjacent to the first nonmagnetic intermediate layer,
wherein the antiferromagnetic layer includes manganese,
wherein the layered magnetization fixed layer includes:
a first ferromagnetic layer and a second ferromagnetic layer provided beside the antiferromagnetic layer;
a third ferromagnetic layer and a fourth ferromagnetic layer provided beside the first nonmagnetic intermediate layer; and a second nonmagnetic intermediate layer provided in between the second ferromagnetic layer and the third ferromagnetic layer, wherein the first ferromagnetic layer includes an alloy as specified by the equation (1), wherein the second ferromagnetic layer, the third ferromagnetic layer, and the fourth ferromagnetic layer include an alloy as specified by the equation (2), wherein the equation (1) is $(Fe_aCo_bNi_c)_d(M)_e$, wherein $0 \leq a < 100$, $0 \leq b < 100$, $0 \leq c < 100$, $a+b+c=100$, $99.5 \geq d \geq 50$, $0.5 \leq e \leq 50$, $d+e=100$; M represents a platinum group metal, and wherein the equation (2) is $(Fe_xCo_yNi_z)_m(B)_n$, wherein $0 \leq x \leq 100$, $0 \leq y \leq 100$, $0 \leq z < 100$, $x+y+z=100$, $m+n=100$, $0 \leq n < 30$, $70 < m \leq 100$; B represents boron.

2. The magnetoresistive element according to the claim 1, wherein the first ferromagnetic layer contains boron (B) of 0.5 at % to 30 at %.

3. The magnetoresistive element according to the claim 1, wherein the platinum group metal (M) is at least one metal selected from the group consisting of platinum (Pt), iridium (Ir), osmium (Os), palladium (Pd), ruthenium (Ru), and rhodium (Rh).

4. The magnetoresistive element according to the claim 1, wherein the first nonmagnetic intermediate layer is a tunnel barrier layer including a magnesium oxide.

5. The magnetoresistive element according to the claim 1, wherein the ranges of a, b, n, and m are: $0 < a < 100$, $0 < b < 100$, $0 < n < 30$, and $70 < m < 100$.

* * * * *